(12) United States Patent
Takahashi et al.

(10) Patent No.: US 11,589,491 B2
(45) Date of Patent: Feb. 21, 2023

(54) ELECTRONIC COMPONENT SET, CAPACITOR, ELECTRONIC-COMPONENT-SET MANUFACTURING METHOD, READING METHOD, AND READER

(71) Applicant: Panasonic Intellectual Property Management Co., Ltd., Osaka (JP)

(72) Inventors: Seita Takahashi, Yamaguchi (JP); Tomoyuki Ishikawa, Yamaguchi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/120,076

(22) Filed: Dec. 11, 2020

(65) Prior Publication Data
US 2021/0100144 A1 Apr. 1, 2021

Related U.S. Application Data

(63) Continuation of application No. PCT/JP2019/024946, filed on Jun. 24, 2019.

(30) Foreign Application Priority Data

Jun. 28, 2018 (JP) .............................. JP2018-123639

(51) Int. Cl.
*H05K 13/08* (2006.01)
*B65D 73/02* (2006.01)
(Continued)

(52) U.S. Cl.
CPC .......... *H05K 13/084* (2018.08); *B65D 73/02* (2013.01); *B65D 75/367* (2013.01); *G06K 7/1417* (2013.01); *H05K 13/0084* (2013.01)

(58) Field of Classification Search
CPC ............. H05K 13/084; H05K 13/0084; H05K 13/0417; B65D 73/02; B65D 75/367; B65D 75/327; G06K 7/1417; G05B 19/418
See application file for complete search history.

(56) References Cited

U.S. PATENT DOCUMENTS

2005/0036274 A1* 2/2005 Suhara ............... H05K 13/0417
361/600

FOREIGN PATENT DOCUMENTS

| CN | 101267727 A | 9/2008 |
|---|---|---|
| JP | 3-178199 | 8/1991 |

(Continued)

OTHER PUBLICATIONS

International Search Report of PCT application No. PCT/JP2019/024946 dated Jul. 23, 2019.
(Continued)

*Primary Examiner* — Matthew Mikels
(74) *Attorney, Agent, or Firm* — McDermott Will & Emery LLP (57) ABSTRACT

An electronic component set includes a plurality of electronic components and a holding member that holds the plurality of electronic components. Each of the plurality of electronic components includes an identification unit. The plurality of electronic components are held by the holding member to allow an optical reader to read the identification unit of the each of the plurality of electronic components.

15 Claims, 8 Drawing Sheets

(51) Int. Cl.
*B65D 75/36* (2006.01)
*G06K 7/14* (2006.01)
*H05K 13/00* (2006.01)

(56) References Cited

FOREIGN PATENT DOCUMENTS

| | | |
|---|---|---|
| JP | 6-156880 | 6/1994 |
| JP | 2003-165514 | 6/2003 |
| JP | 2004-165273 | 6/2004 |
| JP | 2013-180792 | 9/2013 |

OTHER PUBLICATIONS

English Translation of Chinese Office Action dated May 5, 2022 for the related Chinese Patent Application No. 201980042421.1.

* cited by examiner

ELECTRONIC COMPONENT SET, CAPACITOR, ELECTRONIC-COMPONENT-SET MANUFACTURING METHOD, READING METHOD, AND READER

RELATED APPLICATIONS

This application is a continuation of the PCT International Application No. PCT/JP2019/024946 filed on Jun. 24, 2019, which claims the benefit of foreign priority of Japanese patent application No. 2018-123639 filed on Jun. 28, 2018, the contents all of which are incorporated herein by reference.

BACKGROUND

1. Technical Field

The present disclosure generally relates to an electronic component set, a capacitor, a method for manufacturing an electronic component set, a reading method, and a reader. And more specifically, an electronic component set including a plurality of electronic components, a capacitor, a method for manufacturing an electronic component set, a reading method, and a reader.

2. Description of the Related Art

Unexamined Japanese Patent Publication No. 3-178199 describes an embossed tape for packaging electronic components that holds a plurality of electronic components in the main body of the embossed tape. This embossed tape for packaging electronic components is provided with a plurality of embossed portions in the main body of the embossed tape, and the electronic components are housed in each embossed portion.

SUMMARY

An electronic component set according to one aspect of the present disclosure includes a plurality of electronic components and a holding member that holds the plurality of electronic components. Each of the plurality of electronic components includes an identification unit. The plurality of electronic components are held by the holding member to allow an optical reader to read the identification unit of the each of the plurality of electronic components.

A capacitor according to another aspect of the present disclosure includes an identification unit. The capacitor is one of a plurality of electronic components that are included in the electronic component set. The electronic component set further includes a holding member that holds the plurality of electronic components. The plurality of electronic components are held by the holding member to allow an optical reader to read the identification unit of the capacitor.

A method for manufacturing the electronic component set according to the one aspect of the present disclosure includes; a step of preparing a holding member and a plurality of electronic components; and a step of causing the holding member to hold the plurality of electronic components.

A method for reading an identification unit in the electronic component set according to the one aspect of the present disclosure includes a step of reading the identification unit from the electronic component set while the plurality of electronic components included in the electronic component set are held by the holding member.

A reader for reading an identification unit in the electronic component set according to the one aspect of the present disclosure includes a reading unit configured to read the identification unit from the electronic component set while the plurality of electronic components included in the electronic component set are held by the holding member.

According to the present disclosure, there is an advantage that work efficiency of reading information of electronic components can be improved.

DETAILED DESCRIPTION OF EMBODIMENT

In electronic components, for example, information of each electronic component may be required before mounting the electronic component or the like. In this case, when the electronic components are housed in the embossed tape for packaging electronic components as described above, it is necessary to unpack the tape once in order to read the information of each electronic component. Thus, there is a problem that the work efficiency of reading the information is low.

The present disclosure has been made in view of solving the above problem, and provides an electronic component set, a capacitor, a method for manufacturing an electronic component set, a reading method, and a reader capable of improving the work efficiency of reading information on electronic components.

First Exemplary Embodiment (1) Overview

Figure 1:
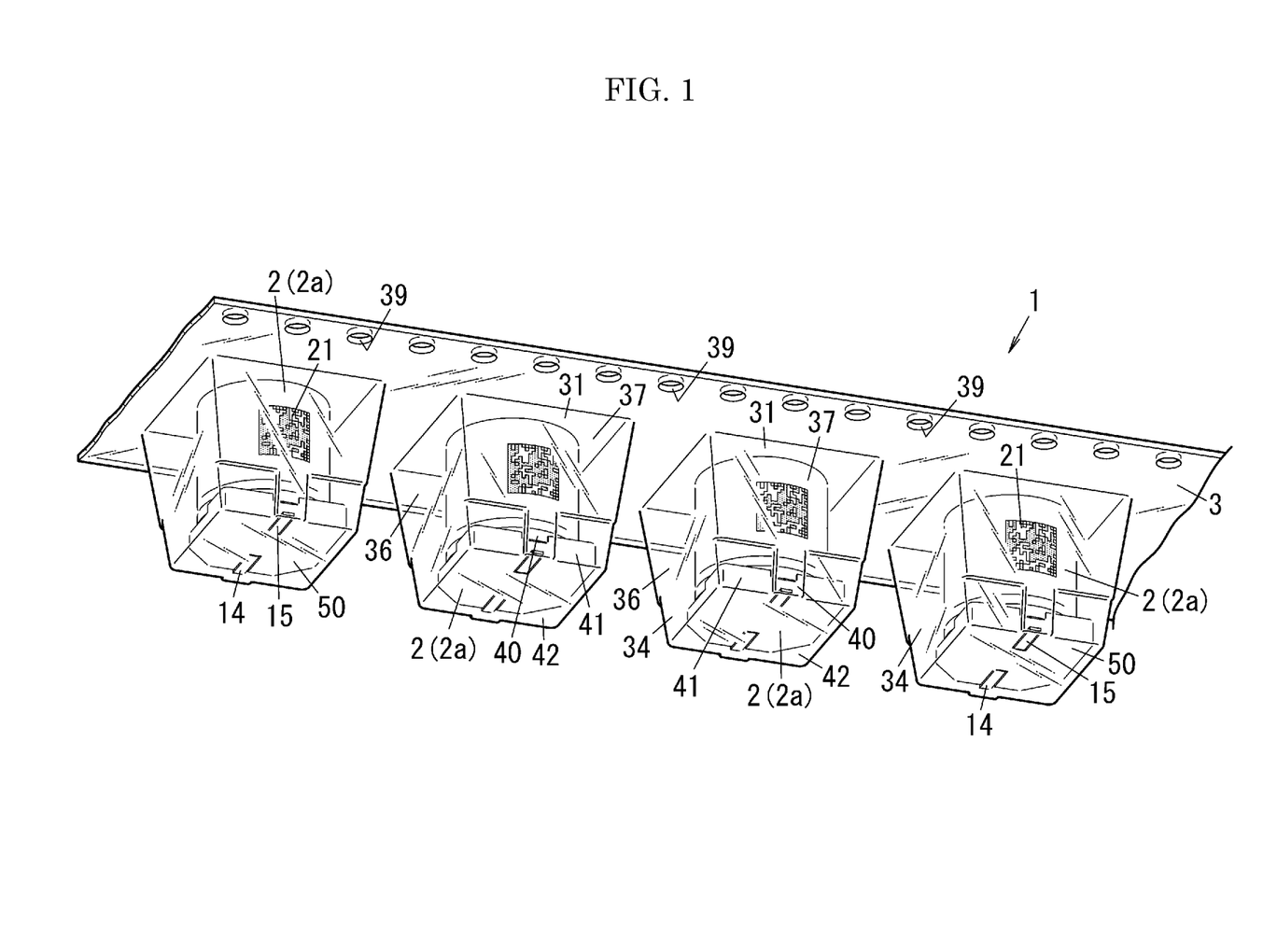
FIG. 1 is a perspective view from below illustrating a part of an electronic component set according to a first exemplary embodiment.
Figure 2:
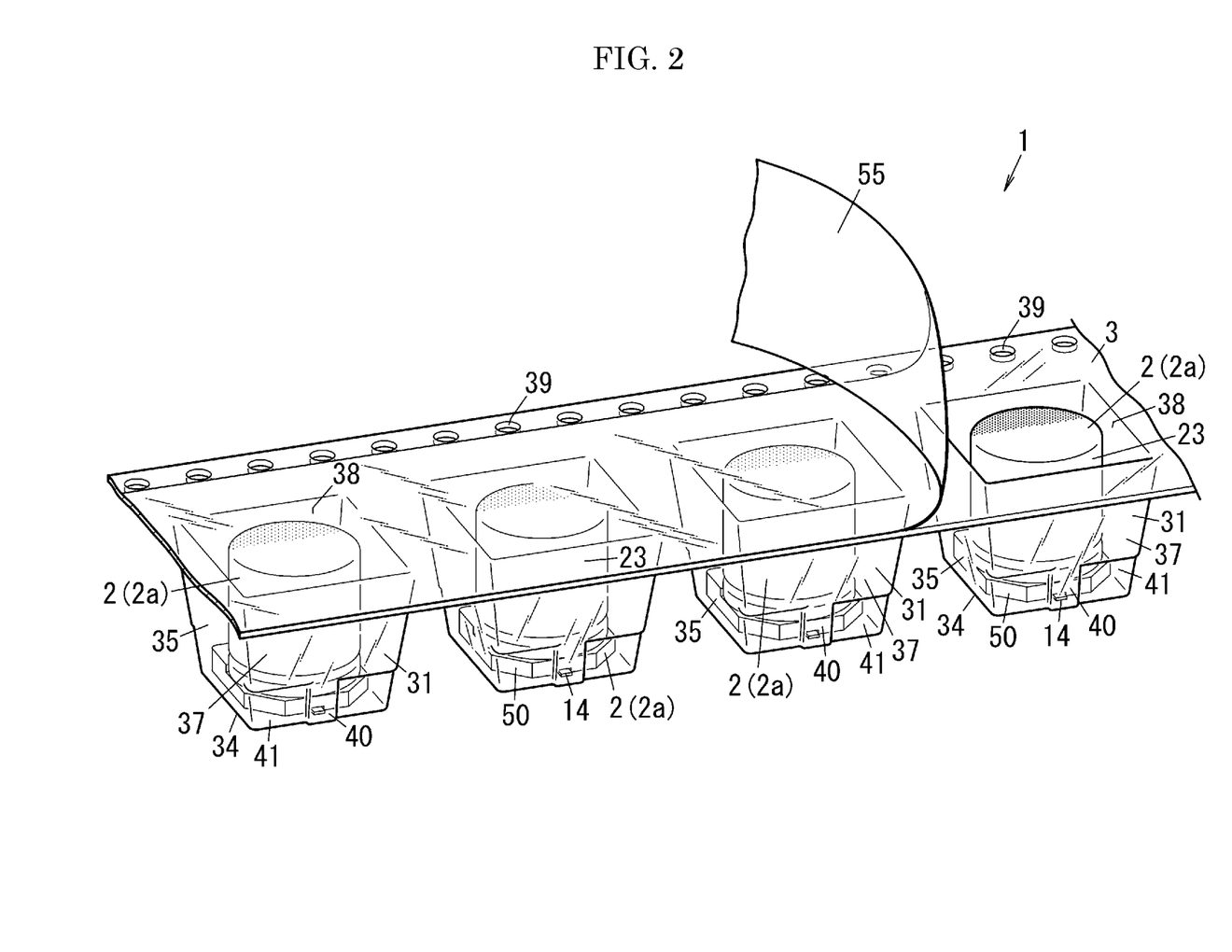
FIG. 2 is a perspective view from above illustrating a part of the electronic component set according to the first exemplary embodiment.

As shown in FIGS. 1 and 2, electronic component set 1 according to the present exemplary embodiment includes a plurality of electronic components 2 and packaging member 3. Each of the plurality of electronic components 2 is, for example, chip type capacitor 2a. Packaging member 3 packages, for example, the plurality of electronic components 2 in order to transport the plurality of electronic components 2. Packaging member 3 holds the plurality of electronic components 2. Here, "holding" means a state in which the plurality of electronic components 2 is not easily detached even if packaging member 3 moves. Specific configurations of "holding" include, for example, a configuration in which electronic components 2 are housed in packaging member 3, and a configuration in which electronic components 2 are adhered to packaging member 3. Each of the plurality of electronic components 2 includes identification unit 21 for identifying each of the plurality of electronic components 2. For example, identification unit 21 includes information that can distinguish the plurality of electronic components 2 from one another. Here, packaging member 3 is an example of a "holding member" recited in the claims.

In electronic component set 1 according to the present exemplary embodiment, while the plurality of electronic components 2 held by packaging member 3, identification unit 21 is located in an area of each of the plurality of electronic components 2, which can be read by optical reader 4. In this case, identification unit 21 can be read by optical reader 4 without removing each electronic component 2 from packaging member 3. That is, identification unit 21 can be read by optical reader 4 without separating the plurality of electronic components 2 from packaging member 3 individually. Thus, in identifying each of electronic components 2, it is possible to eliminate the work of taking out each of electronic components 2 from packaging member 3. Further, for example, even when electronic components 2 cannot be repackaged after once detaching electronic components 2 from packaging member 3, and cannot be returned to their original state, identification unit 21 can be read. In such a case, electronic component set 1 according to the present exemplary embodiment is particularly useful.

(2) Details (2.1) Electronic Components

Figure 3:
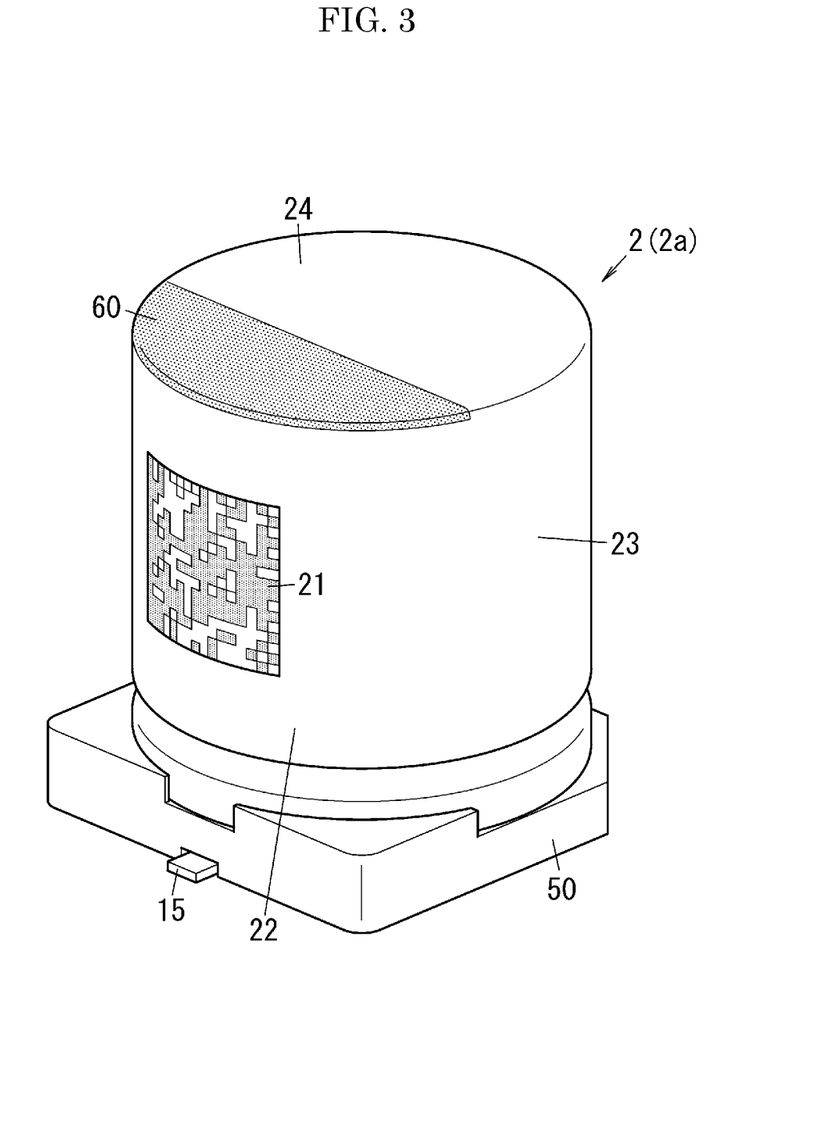
FIG. 3 is a perspective view illustrating an electronic component used for the electronic component set according to the first exemplary embodiment.

Capacitor 2a will be described as an example of electronic components 2 according to the present exemplary embodiment. FIG. 3 is a perspective view illustrating an electrolytic capacitor, which is capacitor 2a. Capacitor 2a of the present exemplary embodiment is a surface mount type electrolytic capacitor, and is a so-called hybrid type electrolytic capacitor in which both a conductive polymer and an electrolytic solution are used for an electrolyte.

Capacitor 2a includes case (exterior) 23, seat plate 50, anode lead terminal 14, and cathode lead terminal 15. A capacitor element (internal element), a sealing member, and an electrolyte are provided inside case 23. The capacitor element includes anode foil, cathode foil, and a separator.

The anode foil includes, for example, metal foil whose surface has been roughened by an etching process or the like. The metal foil is, for example, aluminum foil. The material of the metal foil is preferably a valve metal such as aluminum, tantalum or niobium, or an alloy thereof. A dielectric layer is formed on a surface of the anode foil by an anodization treatment.

The cathode foil includes, for example, metal foil. The metal foil is, for example, aluminum foil. The material of the metal foil is preferably a valve metal such as aluminum, tantalum, niobium or an alloy thereof.

The separator is disposed between the anode foil and the cathode foil to prevent contact between the anode foil and the cathode foil. The separator is made of an insulating material. The separator is not particularly limited, but may be, for example, an insulating paper or a non-woven fabric containing cellulose, polyethylene terephthalate, vinylon, polyamide, glass, or the like as a main component.

Anode lead terminal 14 is connected to the anode foil. The material of anode lead terminal 14 is not particularly limited as long as it is a conductive material. A part of anode lead terminal 14 is connected to the anode foil inside case 23. The other part of anode lead terminal 14 is exposed to the outside of case 23.

Cathode lead terminal 15 is connected to the cathode foil. The material of cathode lead terminal 15 is not particularly limited as long as it is a conductive material. A part of cathode lead terminal 15 is connected to the cathode foil inside case 23. The other part of cathode lead terminal 15 is exposed to the outside of case 23.

The anode foil to which anode lead terminal 14 is connected and the cathode foil to which cathode lead terminal 15 is connected are disposed so as to face each other with the separator interposed therebetween. Then, the anode foil, the cathode foil, and the separator are wound in a roll shape to form a capacitor element (winding element) in a cylindrical shape. After forming the capacitor element, a defect generated in the dielectric layer may be repaired by performing a restoring anodization treatment.

Case 23 is formed in a cylindrical shape with an opening at lower surface and is made of a material such as aluminum. The capacitor element is housed in case 23 such that a part of anode lead terminal 14 and a part of cathode lead terminal 15 are exposed to the outside.

In capacitor 2a, an electrolyte is formed between the anode foil and the cathode foil inside case 23. The electrolyte includes a liquid electrolyte (electrolytic solution) and a solid electrolyte. The electrolytic solution contains a solvent, and an acid component and a base component. As the solid electrolyte, a conductive polymer, a tetracyanoquinodimethane (TCNQ) complex salt, or the like is used. The material of the conductive polymer may be, for example, polypyrrole, polythiophene, polyaniline, or a derivative thereof, and a dopant may be added. The conductive polymer may be adhered in a film form to at least a part of a surface of a dielectric film of the anode foil, a surface of the cathode foil, and a surface of the separator, for example. Further, the electrolytic solution (electrolyte) may be injected into case 23 after the capacitor element is housed.

The sealing member is made of an elastic material such as rubber. The sealing member is attached to case 23 so as to close the opening at the lower surface of the case 23. Two through holes are formed in the sealing member.

Seat plate 50 is made of an insulating material. Seat plate 50 is attached to a lower part of case 23. Two through holes are formed in seat plate 50 at positions respectively corresponding to the through holes of the sealing member. Further, on a bottom surface (lower surface) of seat plate 50, two housing recesses extending outward from outlets of the respective through holes are formed.

Anode lead terminal 14 and cathode lead terminal 15 projecting from the inside of case 23 to the outside are respectively passed through the through holes of the sealing member and are respectively passed through the through holes of seat plate 50. And each of anode lead terminal 14 and cathode lead terminal 15 is bent outward. The outwardly bent portion of anode lead terminal 14 is housed in one of the two housing recesses of seat plate 50. The outwardly bent portion of cathode lead terminal 15 is housed in another one of the two housing recesses of seat plate 50.

Display unit 60 indicating characteristics of capacitor 2a may be provided on top surface 24 of case 23. Display unit 60 is printed on top surface 24 of case 23 to be displayed. Display contents of display unit 60 are, for example, a black-painted polarity display indicating a polarity (negative electrode side) of capacitor 2a, a capacitance value (numerical value: unit is µF), a rated voltage symbol, a series symbol, a lead-free compatible product mark (black dot), and a lot number (number indicating production lot). In capacitor 2a of the present exemplary embodiment, a polarity display is attached to a first area (left side in FIG. 3) of top surface 24 of case 23.

Further, as shown in FIG. 3, case (exterior) 23 is provided with identification unit 21 in addition to display unit 60. Identification unit 21 is provided on case 23 by display. More specifically, identification unit 21 is printed directly on case 23. Further, identification unit 21 is located on side surface 22 of case 23. In other words, identification unit 21 is on an outer peripheral surface of cylindrical case 23. In the present exemplary embodiment, identification unit 21 is a matrix-type two-dimensional code. Identification unit 21 is located in an area corresponding to anode lead terminal 14 or cathode lead terminal 15. That is, identification unit 21 is located in the area above a position of anode lead terminal 14 or cathode lead terminal 15, which are exposed from an outer side surface of the seat plate 50.

Here, identification unit 21 indicates, for example, identification information for identifying the plurality of electronic components 2 from one another. That is, the production lot of the capacitor element (internal element) of capacitor 2a includes a plurality of small units (aggregates), and identification unit 21 is, for example, an identifier for identifying the plurality of small units. In other words, the production lot includes a plurality of aggregates (small units), each including a plurality of capacitors 2a. Identification unit 21 can specify a small unit to which corresponding capacitor 2a belongs among the plurality of small units included in the production lot having the plurality of capacitors 2a as one lot.

The minimum number of capacitors 2a included in one small unit is one. The number of capacitors 2a included in each of the plurality of small units is preferably the same as that of each other, but may be different. For example, each of the plurality of small units may include one to ten capacitors 2a. Each of the plurality of small units may include ten or more and less than 100 capacitors 2a. Each of the plurality of small units may include 100 or more and less than 1,000 capacitors 2a. Each of the plurality of small units may include 1,000 or more and less than 10,000 capacitors 2a. Each of the plurality of small units may include 10,000 or more capacitors 2a.

In the present exemplary embodiment, the number of capacitors 2a included in each of the plurality of small units is one. In other words, in the present exemplary embodiment, the small unit is an individual piece. In short, the plurality of capacitors 2a included in one production lot is provided with a plurality of different identification units 21. In particular, in the present exemplary embodiment, all capacitors 2a included in all the production lots are provided with identification units 21 different from one another.

Each identification unit 21 is provided on case (exterior) 23 of each capacitors 2a, for example, when capacitor 2a is manufactured. Further, at the time of manufacturing capacitor 2a, manufacturing information at the time of manufacturing each capacitor 2a is stored as management information in the database of a management device in association with identification unit 21 attached to capacitor 2a. Thus, by reading identification unit 21 of capacitor 2a and collating it with the management information of the database, it is possible to individually identify the manufacturing information (information at the time of manufacturing) of capacitor 2a.

In one example, the manufacturing information includes information indicating a state of a manufacturing system of capacitor 2a, information indicating an inspection result of capacitor 2a, and the like. The information on the state of the manufacturing system includes, for example, information such as driving speed (rotational speed of a motor) of a device included in the manufacturing system, information such as a temperature and voltage of a restoring anodization apparatus, and a temperature of an electrolyte forming device. The manufacturing information may include conditions for forming the electrolyte. The information indicating the inspection result includes, for example, information indicating a rank of evaluation of the inspection result (rank indicating a distinction among excellent, good, and fair). That is, the manufacturing information of the present disclosure refers to information indicating the state of individual products at the time of manufacturing, rather than information indicating general specifications of the products.

(2.2) Packaging Member

Figure 4:
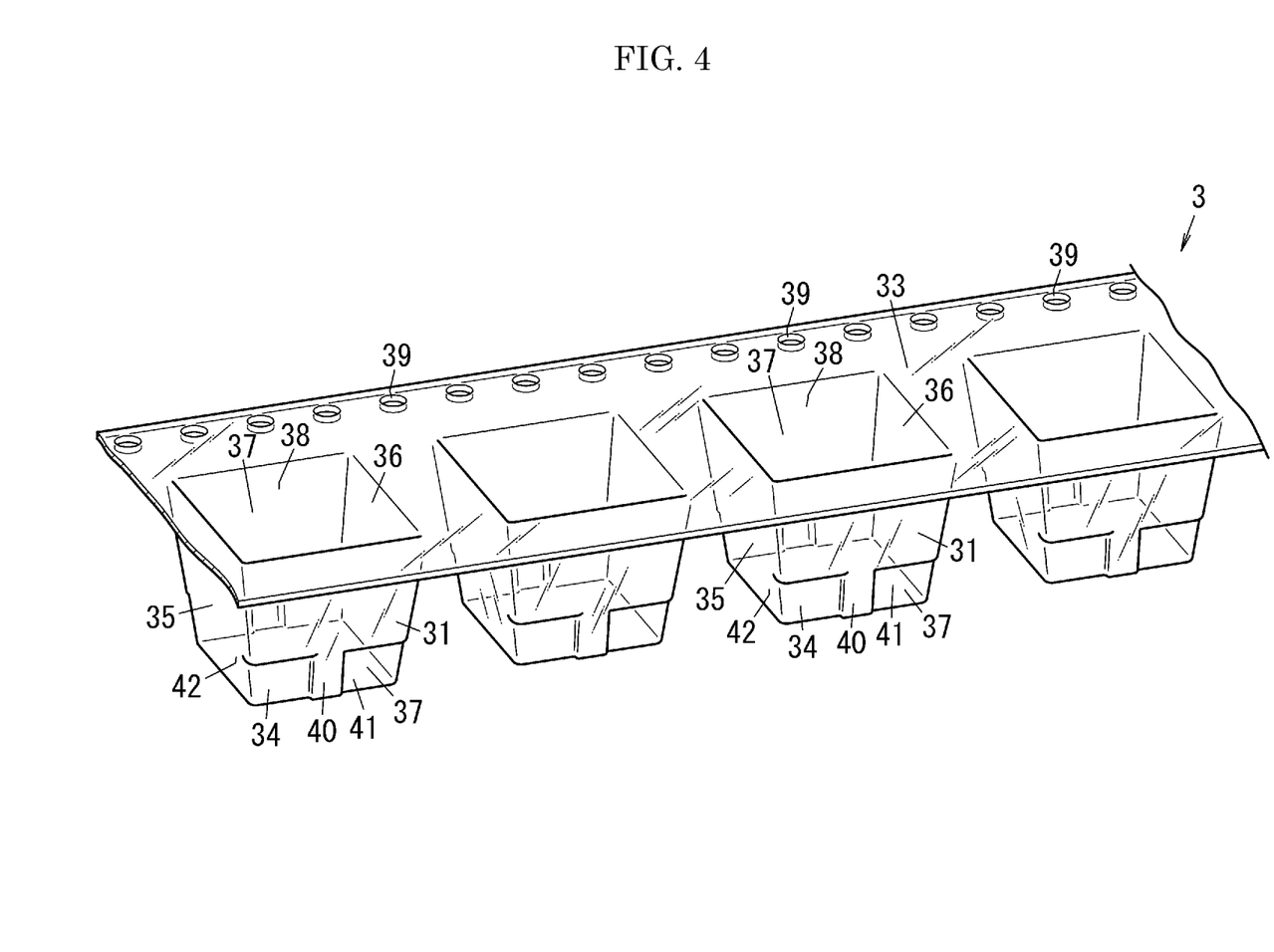
FIG. 4 is a perspective view illustrating a part of a packaging member used for the electronic component set according to the first exemplary embodiment.

Packaging member 3 illustrated in the present exemplary embodiment is a so-called embossed carrier tape. Packaging member 3 has an elongated shape. In other words, packaging member 3 is formed narrow and long like a strip shape. As shown in FIG. 4, packaging member 3 includes base material (tape) 33 and housing portion (embossed portion) 34.

Base material 33 is formed in a tape shape. A width of base material 33 is greater than a width of opening 38 of housing portion 34. The position of a central portion in a width direction of base material 33 is substantially identical to the position of a central portion in a width direction of housing portion 34. Thus, both side end parts of base material 33, which extend along a longitudinal direction, are located beside both sides of opening 38 of housing portion 34, respectively. The "width direction" is a short-length direction of base material 33. The short-length direction of base material 33 is a direction orthogonal to the longitudinal direction of base material 33. Base material 33 includes a plurality of catches 39 for hooking. Each of the plurality of catches 39 for hooking is located in a side end part of base material 33 in the short-length direction. The plurality of catches 39 for hooking are arranged at predetermined intervals along the longitudinal direction of base material 33. Each of the plurality of catches 39 for hooking is a hole penetrating base material 33 in a thickness direction. Each of the plurality of catches 39 for hooking is a round hole. Meanwhile, it is not limited to this, each of the plurality of catches 39 for hooking has an arbitrary shape such as a square hole or an elongated hole. The plurality of catches 39 for hooking are used for moving (transporting) electronic component set 1 along the longitudinal direction. That is, each catch 39 for hooking is a portion hooked on a driving body such as a gear, whereby force is applied from the driving body to electronic component set 1 to move electronic component set 1. Thus, catch 39 for hooking may be in a form of being hooked on the driving body, and may be, for example, a hole that does not penetrate, a protrusion, or a notch.

Housing portion 34 is a recess formed on one of both surfaces of base material 33 in the thickness direction. That is, housing portion 34 projects on another one of the both surfaces of base material 33. The one of the both surfaces of base material 33 on which housing portion 34 is recessed has opening 38 of housing portion 34. Packaging member 3 includes a plurality of housing portions 34. The plurality of housing portions 34 are arranged along the longitudinal direction of base material 33. The plurality of housing portions 34 are aligned at predetermined intervals. Each of the plurality of housing portions 34 has a bottomed square cylinder shape constituted by front surface 35, rear surface 36, a pair of side surfaces 37, and bottom surface 42. Front surface 35 and rear surface 36 face each other in the longitudinal direction of base material 33. The pair of side surfaces 37 faces each other in the short-length direction of base material 33. Opening 38 of each housing portion 34 has a quadrangular shape. Meanwhile, each housing portion 34 may have a bottomed cylindrical shape, and may have an arbitrary shape. Each housing portion 34 has a size capable of housing each electronic component 2 one by one.

Each of the pair of side surfaces 37 of each housing portion 34 includes window 31, terminal housing portion 40, and seat plate housing portion 41. Window 31 is a portion closer to opening 38 than terminal housing portion 40 and seat plate housing portion 41 are. Further, terminal housing portion 40 is located at a center of seat plate housing portion 41 in the longitudinal direction of base material 33. A size from an upper end to a lower end of window 31 (size from an end beside opening 38 to an upper end of seat plate housing portion 41) is slightly greater than a size of a portion above seat plate 50 in capacitor 2a. A size of terminal housing portion 40 in a front-rear direction (size in a direction along the longitudinal direction of base material 33) is slightly greater than a width of each of anode lead terminal 14 and cathode lead terminal 15. A size from the upper end to a lower end of seat plate housing portion 41 (size from the upper end of seat plate housing portion 41 to bottom surface 42) is slightly greater than a thickness of seat plate 50 in capacitor 2a.

Window 31 has light transmission. In other words, window 31 is so transparent that an inside of housing portion 34 can be seen through. As long as window 31 has light transmission, window 31 may be translucent, for example, transparent like frosted glass. Window 31 may also be slightly colored. Window 31 is a portion for reading identification unit 21 of electronic component 2 housed in housing portion 34. Thus, it is preferable that window 31 is hard to reflect light and has high light transmission. By this configuration, light can easily reach identification unit 21 and the light reflected from identification unit 21 can be easily taken out from housing portion 34 to the outside. Hence, readability of identification unit 21 can be improved.

Window 31 has a flat shape. In other words, window 31 is a surface having almost no unevenness, warpage, distortion, or the like. By this configuration that window 31 has a flat shape in this way, loss due to light reflection, refraction, or the like is less likely to occur in window 31, and light transmission of window 31 is improved. Thus, the light can easily reach identification unit 21, and the light reflected from identification unit 21 can be easily taken out from housing portion 34 to the outside Hence, the readability of identification unit 21 can be improved.

Packaging member 3 is a resin molded product. As the resin, polycarbonate, polyethylene terephthalate, or the like can be used in consideration of light transmission, heat resistance, strength, and the like. That is, it is sufficient for packaging member 3 to transmit the light required for reading by reader 4.

In the present disclosure, the "light" is mainly visible light, but may include infrared light and ultraviolet light.

An outside surface of window 31 and an outside surface of terminal housing portion 40 are continuous with no step (in same plane). Further, an inside surface of window 31 and an inside surface of terminal housing portion 40 are continuous with no step (in same plane). On the other hand, an outside surface of seat plate housing portion 41 is continuous with the outside surface of window 31 and the outside surface of terminal housing portion 40 with a step difference. Further, an inside surface of seat plate housing portion 41 is also continuous with the inside surface of window 31 and the inside surface of terminal housing portion 40 with a step difference. That is, window 31 and terminal housing portion 40 are projecting outward from seat plate housing portion 41.

Window 31 may be formed only on side surface 37 facing identification unit 21.

(2.3) Electronic Component Set and Manufacturing Method Thereof

Electronic component set 1 according to the present exemplary embodiment includes electronic component 2 and packaging member 3. In other words, electronic component set 1 is constituted by packaging member 3 that packages electronic component 2. The plurality of electronic components 2 are held by packaging member 3. That is, even if electronic component set 1 moves, the plurality of electronic components 2 does not separate from packaging member 3, and integrally move with packaging member 3. Each of the plurality of electronic components 2 is held by packaging member 3 in a state that it is housed in housing portion 34. That is, each of the plurality of electronic components 2 is held by being housed in a space surrounded by front surface 35, rear surface 36, the pair of side surfaces 37, and bottom surface 42 in packaging member 3.

The plurality of electronic components 2 are housed one by one in a plurality of housing portions 34 of packaging member 3. In this case, a lower surface of the seat plate 50 of electronic component 2 is placed on bottom surface 42. Further, seat plate 50 is located corresponding to seat plate housing portion 41. That is, an outer peripheral surface of seat plate 50 is located so as to face the inside surface of seat plate housing portion 41. Further, anode lead terminal 14 is located corresponding to terminal housing portion 40 of one side surface 37. Further, cathode lead terminal 15 is located corresponding terminal housing portion 40 of another side surface 37. That is, a tip end face of anode lead terminal 14 and a tip end face of cathode lead terminal 15 are located so as to respectively face the inside surfaces of terminal housing portion 40 of side surfaces 37. Further, case 23 is located corresponding to window 31. In other words, the outer peripheral surface of case 23 is located so as to face the inside surface of window 31.

In electronic component set 1 in which the plurality of electronic components 2 are held by packaging member 3, identification unit 21 is positioned on each of the plurality of electronic components 2 so as to be read by optical reader 4. In other words, identification unit 21 is positioned on each of the plurality of electronic components 2 so as to be recognized by optical reader 4 through housing portion 34 in a state that the plurality of electronic components 2 are respectively housed in a plurality of housing portions 34. In electronic component set 1 according to the present exemplary embodiment, window 31 of each housing portion 34 of packaging member 3 is located at an area corresponding to identification unit 21 of electronic component 2 housed in each of the plurality of housing portions 34. In other words, electronic component 2 is housed in each of the plurality of hosing portions 34 such that window 31 and identification unit 21 of one side surface 37 (side surface 37 on which catch 39 for hooking is provided) face each other. In this way, identification unit 21 can be read by optical reader 4 through window 31. That is, the light (reflected light) from identification unit 21 is received by reader 4 through window 31 having light transmission, so that identification unit 21 is read by reader 4.

In electronic component set 1 according to the present exemplary embodiment, the plurality of electronic components 2 are arranged in the longitudinal direction of packaging member 3. In other words, the plurality of electronic components 2 are arranged so as to be housed in the plurality of housing portions 34 arranged in one-to-one correspondence in the longitudinal direction of packaging member 3. Further, a plurality of identification units 21 of the plurality of electronic components 2 face the same direction. That is, in all electronic components 2, the plurality of identification units 21 face one direction orthogonal to a longitudinal direction of electronic component set 1. As a result, each of the plurality of identification units 21 is disposed on an area readable from a direction intersecting the longitudinal direction of electronic component set 1. In other words, identification unit 21 is disposed on an area readable from a side position of electronic component set 1. Hence, identification unit 21 can be read by reader 4 that is located in the direction (side) intersecting the longitudinal direction of electronic component set 1.

In electronic component 2 housed in housing portion 34, a tip portion of anode lead terminal 14 and a tip portion of cathode lead terminal 15 are respectively housed in terminal housing portions 40 of side surfaces 37. Thus, when electronic component 2 is about to rotate around an axial direction of case 23 in housing portion 34, the tip portion of anode lead terminal 14 and the tip portion of cathode lead terminal 15 each come into contact with a step between terminal housing portion 40 and seat plate housing portion 41. Hence, it is possible to prevent electronic component 2 from rotating in housing portion 34. In this case, identification unit 21 of electronic component 2 can be prevented from deviating (being shifted) from a position facing window 31. Thus, it is possible to reduce a situation that identification unit 21 is difficult to be read by reader 4.

In FIG. 1, the plurality of electronic components 2 are held by packaging member 3 such that identification unit 21 faces the direction toward catch 39 for hooking, but the present disclosure is not limited to this. The plurality of electronic components 2 may be held by packaging member 3 such that identification unit 21 faces a direction opposite to catch 39 for hooking.

Electronic component set 1 as described above is manufactured as follows.

First, a method for manufacturing electronic component set 1 according to the present exemplary embodiment includes a step of causing packaging member 3 to hold the plurality of electronic components 2. In other words, the method for manufacturing electronic component set 1 according to the present exemplary embodiment includes a step of inserting and housing one electronic component 2 in each of a plurality of housing portions 34. Here, electronic component 2 is inserted into each of the plurality of housing portions 34 through opening 38. Further, electronic component 2 is housed in housing portion 34 such that case 23 is disposed upward and seat plate 50 is disposed downward. In this case, electronic component 2 is housed in housing portion 34 by firstly entering anode lead terminal 14 and cathode lead terminal 15 to housing portion 34. Each of the tip portion of anode lead terminal 14 and the tip portion of cathode lead terminal 15 pass through the position of window 31 of each side surface 37, and then is housed in terminal housing portion 40 of each side surface 37. In this case, since there is no step between window 31 and terminal housing portion 40, each of the tip portion of anode lead terminal 14 and the tip portion of cathode lead terminal 15 can be smoothly housed in terminal housing portion 40. When each of the tip portion of anode lead terminal 14 and the tip portion of cathode lead terminal 15 is housed in terminal housing portion 40, identification unit 21 is automatically disposed at a position facing window 31 of one side surface 37. Top surface 24 of electronic component 2 is positioned below opening 38.

As shown in FIG. 2, after electronic component 2 is housed in housing portion 34, opening 38 is closed by lid member 55. Lid member 55 is a so-called cover tape, which is an elongated (strip-shaped) resin film. Lid member 55 is attached to a surface of base material 33 so as to cover opening 38. Here, catch 39 for hooking is not covered by lid member 55. That is, side end part of lid member 55, which extends along the longitudinal direction, does not cover across an area for catches 39 for hooking. Thus, a width of lid member 55 is smaller than a width of base material 33. Lid member 55 is a film of a polyolefin-based thermoplastic resin such as polypropylene. Hence, lid member 55 can be attached to the surface of base material 33 by heat welding. One lid member 55 may close a plurality of openings 38. Meanwhile, a plurality of lid members 55 may close openings 38 one by one. Lid member 55 is peeled off from base material 33 when electronic component 2 is taken out from packaging member 3. Then, each opening 38 is opened and electronic component 2 can be taken out from housing portion 34.

(2.4) Reader and Reading Method

Figure 5:
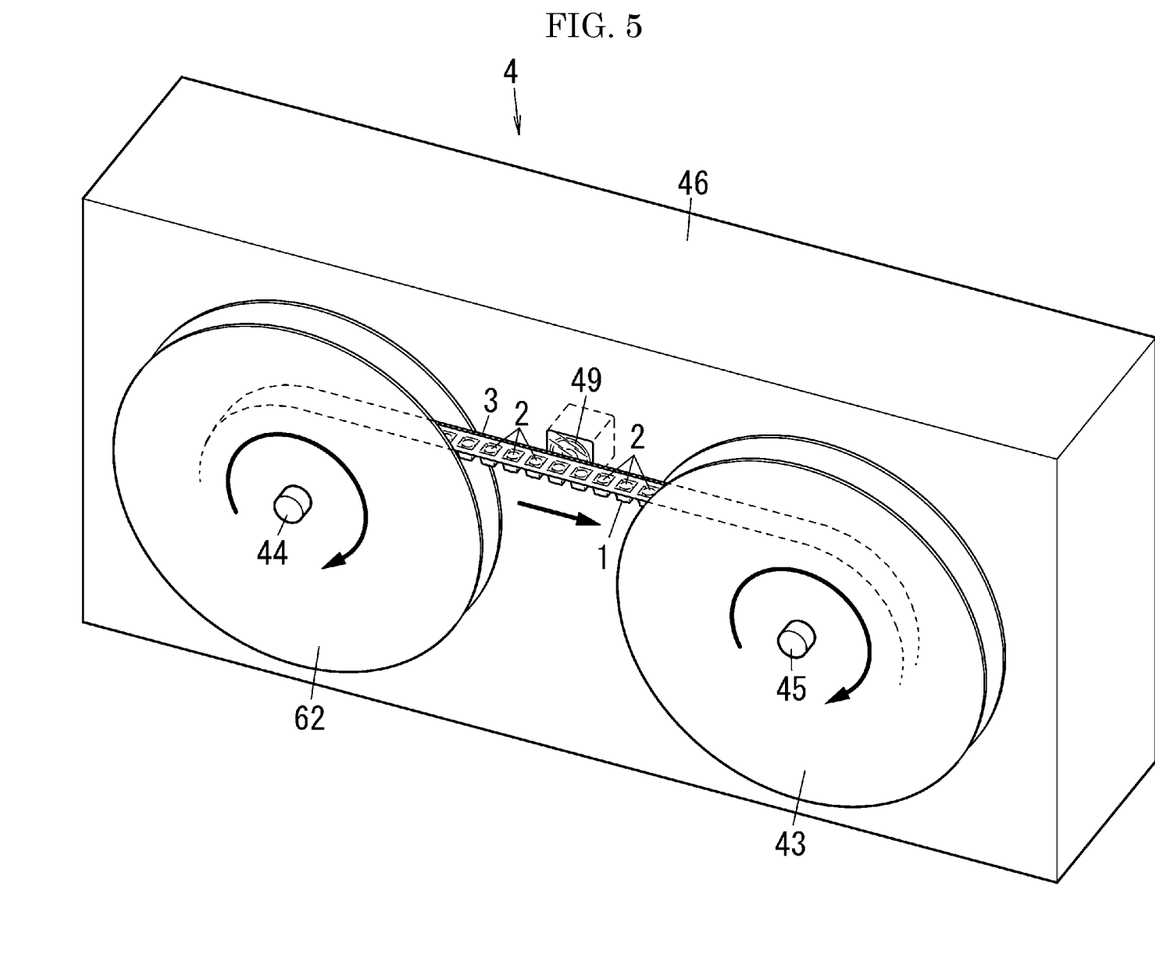
FIG. 5 is a schematic perspective view illustrating a reader that reads an identification unit from the electronic component set according to the first exemplary embodiment.

Reader 4 according to the present exemplary embodiment includes reading unit 49 that reads identification unit 21 from electronic component set 1 in a state that the plurality of electronic components 2 are held by packaging member 3. In other words, reader 4 includes reading unit 49 capable of reading identification unit 21 without individually taking out electronic components 2 from packaging member 3.

As shown in FIG. 5, optical reader 4 includes reading unit 49 and shafts 44, 45 that hold a pair of reels 62, 43. Further, reader 4 includes a unit (extracting unit) for extracting information from an image of identification unit 21 captured by reading unit 49. The extracting unit may be separate from reading unit 49. For example, the extracting unit may be in a server or the like connected via the Internet or the like.

Reading unit 49 may be disposed so as to face one outside surface of case 46. Reading unit 49 may be a device capable of capturing an image of identification unit 21, and is configured with, for example, a light receiving sensor such as a charge coupling device (CCD) area sensor, an imaging optical unit having an imaging lens, a lighting device such as a light emitting diode (LED), or the like.

Each of the pair of reels 62, 43 is disposed on an outside surface of case 46, to which reading unit 49 faces. Each of the pair of reels 62, 43 is detachable from case 46. Reel 62 at one side is a feeder, and electronic component set 1 is wound around reel 62. Reel 43 at another side is a receiver, and electronic component set 1 is not wound on reel 43. Then, after electronic component set 1 is bridged between reel 62 and reel 43, reel 62 is rotated around shaft 44, and reel 43 is rotated around shaft 45 in the same direction as reel 62. As a result, electronic component set 1 is moved (conveyed) to reel 43 and wound up while being unwound from reel 62. Meanwhile, when electronic component set 1 moves from reel 62 to reel 43, electronic component set 1 passes in front of reading unit 49, and at this time, the image of identification unit 21 is captured and read by reading unit 49.

Figure 6:
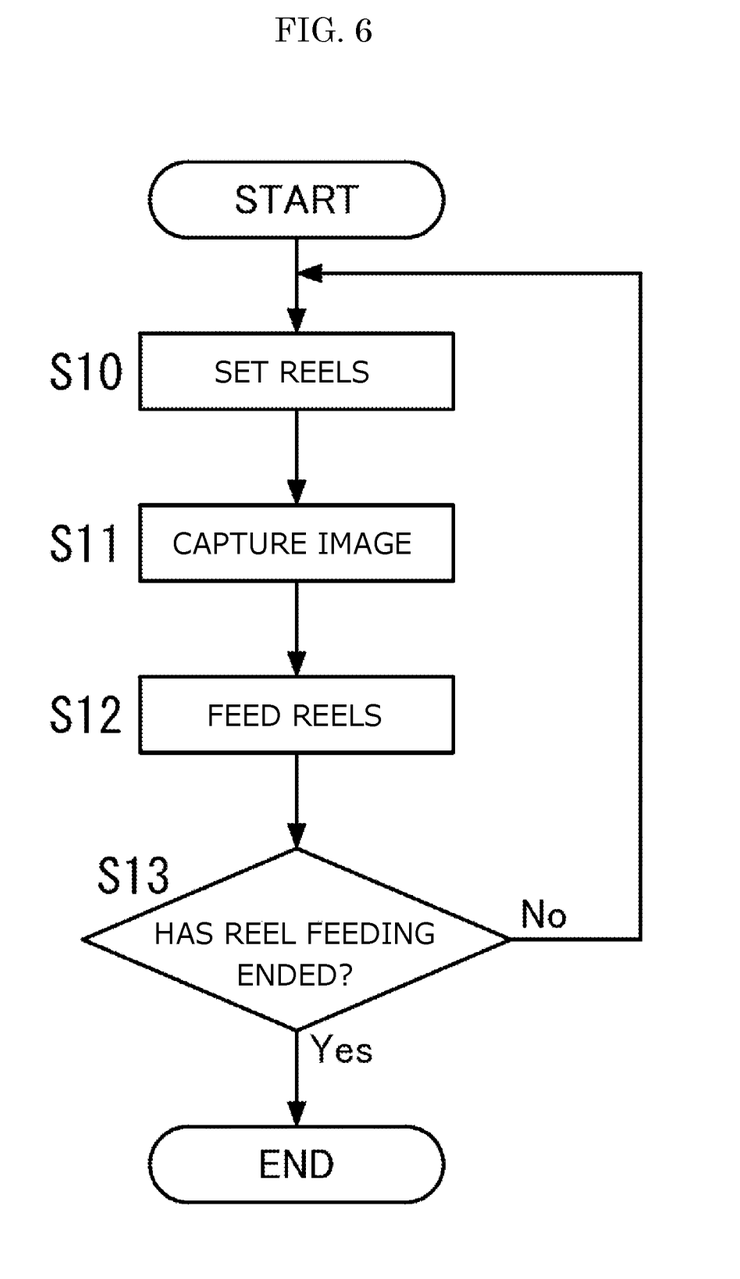
FIG. 6 is a block diagram illustrating a reading method for reading the identification unit from the electronic component set according to the first exemplary embodiment.

In a reading method according to the present exemplary embodiment, identification unit 21 is read from electronic component set 1 in a state that the plurality of electronic components 2 are held by packaging member 3. In other words, the reading method enables reading of identification unit 21 without individually taking out electronic components 2 from packaging member 3. FIG. 6 shows the reading method in a flowchart. In reel setting step S10, reels 62 and 43 are rotated to cause one electronic component 2 be disposed in front of reading unit 49. Then, in imaging step S11, an image of identification unit 21 in electronic component 2 disposed in front of reading unit 49 is captured and read. Next, in reel feeding step S12, by rotating reels 62 and 43, electronic component 2 in which identification unit 21 has been imaged is fed to reel 43. After that, in reel feeding end determining step S13, if it is determined that electronic component set 1 wound around reel 62 has reached an end, reading process of identification unit 21 is finished. On the other hand, in reel feeding end determining step S13, if it is determined that electronic component set 1 wound around reel 62 has not reached the end, the process returns to reel setting step S10 and the reading process is repeated. In this way, identification units 21 of electronic components 2 held in the plurality of electronic component sets 1 can be continuously read one by one in order.

Each electronic component sets 1 that is elongated (strip-shaped) may be shipped in a state that it is wound on a reel.

(3) Modifications

The first exemplary embodiment described above is only one of the various exemplary embodiments of the present disclosure. Further, the first exemplary embodiment described above can be changed in various ways depending on the design and the like as long as the purpose of the present disclosure can be achieved. Some of the modifications of the first exemplary embodiment are listed below. The above exemplary embodiment and the following modifications can be combined as appropriate.

Each electronic component 2 is not limited to capacitor 2a having the above-described configuration. For example, electronic component 2 may be an electric double-layer capacitor (EDLC), a ceramic capacitor, or the like. The electronic component may be a solid electrolytic capacitor using a solid electrolyte such as a conductive polymer, an electrolytic capacitor using an electrolytic solution, or an electrolytic capacitor using a solid electrolyte such as a conductive polymer, and an electrolytic solution (may be only a solvent). The capacitor may be a so-called sleeve type. Further, the anode of capacitor 2a is not limited to anode foil, and may be a porous sintered body. Further, the cathode of capacitor 2a may take various forms as long as it functions as a cathode.

In the manufacturing method of the first exemplary embodiment, some steps may be omitted as appropriate, and/or other steps may be added as appropriate.

Electronic component 2 is not limited to a capacitor, and may be another passive component. For example, the electronic component may be a resistance element, an inductor, or the like.

An exterior of electronic component 2 is not limited to a case. The exterior may be, for example, a resin mold.

Identification unit 21 is not limited to the two-dimensional code printed on a side surface of the exterior. Identification unit 21 may be, for example, a one-dimensional code (bar code), a symbol, a character, or the like. Further, an amount of information in identification unit 21 may be increased by colorizing with colors in addition to black and white. Alternatively, identification unit 21 may be an integrated circuit (IC) chip, a tag, or the like. Identification unit 21 does not have to be attached to the exterior by printing.

For example, identification unit 21 may be attached to the exterior by attaching a sticker on which identification unit 21 is described to the exterior. Identification unit 21 may be attached to a place other than the side surface of the exterior (for example, a top surface or a bottom surface).

For example, when management information includes manufacturing device information for distinguishing a plurality of manufacturing devices, it is possible to determine which device has manufactured electronic component 2. That is, it is possible to determine which of the plurality of manufacturing devices has manufactured electronic component 2 by simply reading identification unit 21. Information capable of matching with a database by reading identification unit 21 is not particularly limited, but may include, for example, a date of manufacture, manufacturing device information for distinguishing the manufacturing device, a serial number, and the like.

Further, the light receiving sensor of reading unit 49 that captures an image of identification unit 21 may be not only an area sensor but also a line sensor.

In the first exemplary embodiment, side surface 37 of housing portion 34 has window 31, terminal housing portion 40, and seat plate housing portion 41, but is not limited to this. For example, in the modification shown in FIG. 7A, entire side surface 37 is formed as window 31, and side surface 37 does not have terminal housing portion 40 and seat plate housing portion 41. In this case, window 31 is larger than those in FIGS. 1 and 2, and identification unit 21 is easier to read.

Figure 7A:
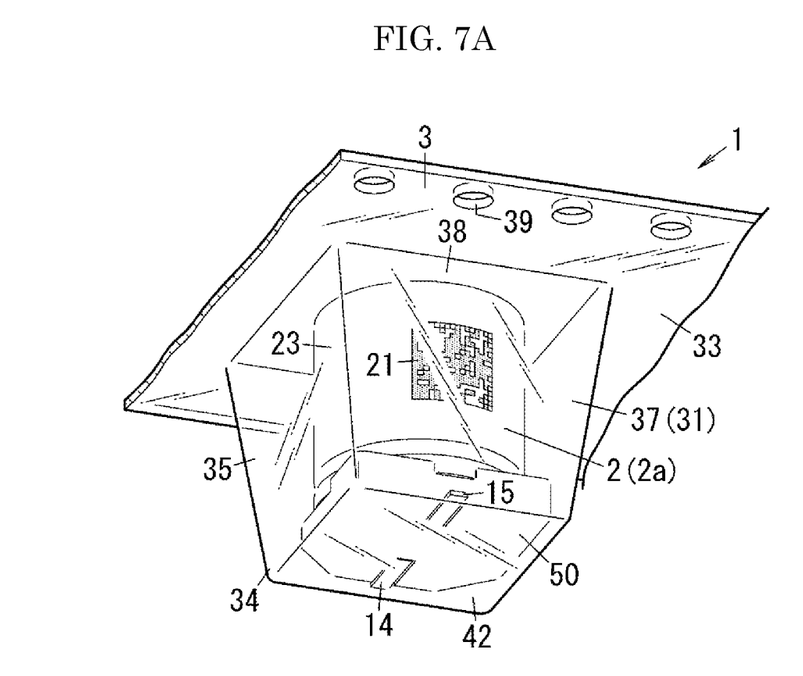
FIG. 7A is a perspective view illustrating a part of a modification of the packaging member used for the electronic component set according to the first exemplary embodiment.
Figure 7B:
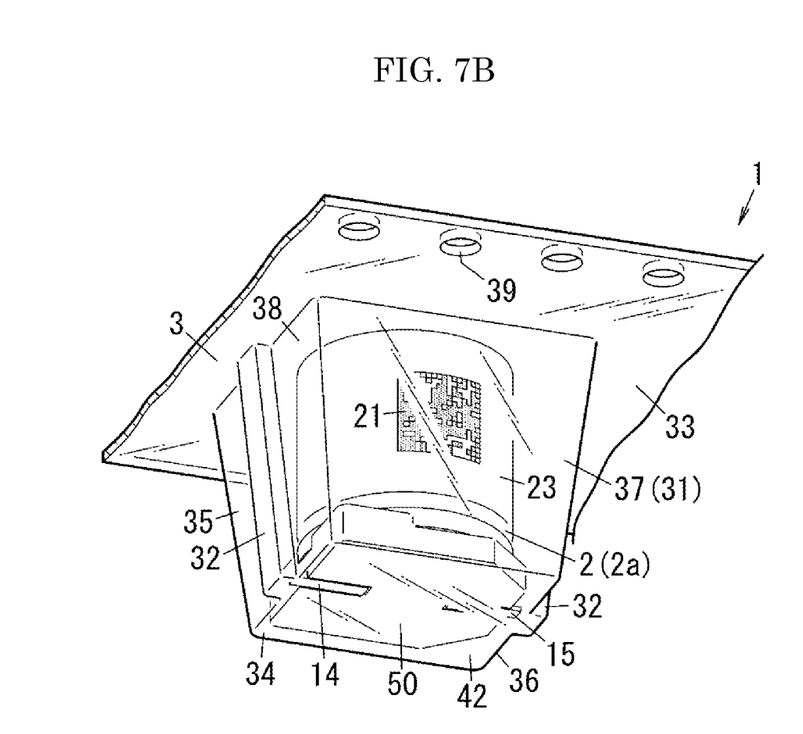
FIG. 7B is a perspective view illustrating a part of another modification of the packaging member used for the electronic component set according to the first exemplary embodiment.

Further, in the modification shown in FIG. 7B, rib 32 is provided at a location other than window 31 in the modification shown in FIG. 7A. In other words, electronic component set 1 of this modification is provided with rib 32 at a position where identification unit 21 is not read. In this modification, front surface 35 and rear surface 36 each have rib 32. Rib 32 is located at a center of packaging member 3 in the short-length direction on each of front surface 35 and rear surface 36. Further, rib 32 projects on a surface of each of front surface 35 and rear surface 36. Rib 32 has a shape long in a thickness direction of packaging member 3 and is formed so as to extend from opening 38 to bottom surface 42. Since rib 32 reinforces a strength of housing portion 34, an occurrence of deformation of housing portion 34 can be suppressed. Hence, it is possible to suppress deterioration in the readability of identification unit 21 due to the deformation of housing portion 34. Rib 32 can also be used as a housing portion for anode lead terminal 14 and cathode lead terminal 15. In this case, identification unit 21 is not positioned at an area above anode lead terminal 14 or cathode lead terminal 15 in electronic component 2, but is positioned at an area deviated by about 90° from the area above anode lead terminal 14 or cathode lead terminal 15 in electronic component 2. As a result, identification unit 21 is disposed at a position facing window 31.

Second Exemplary Embodiment

Figure 8:
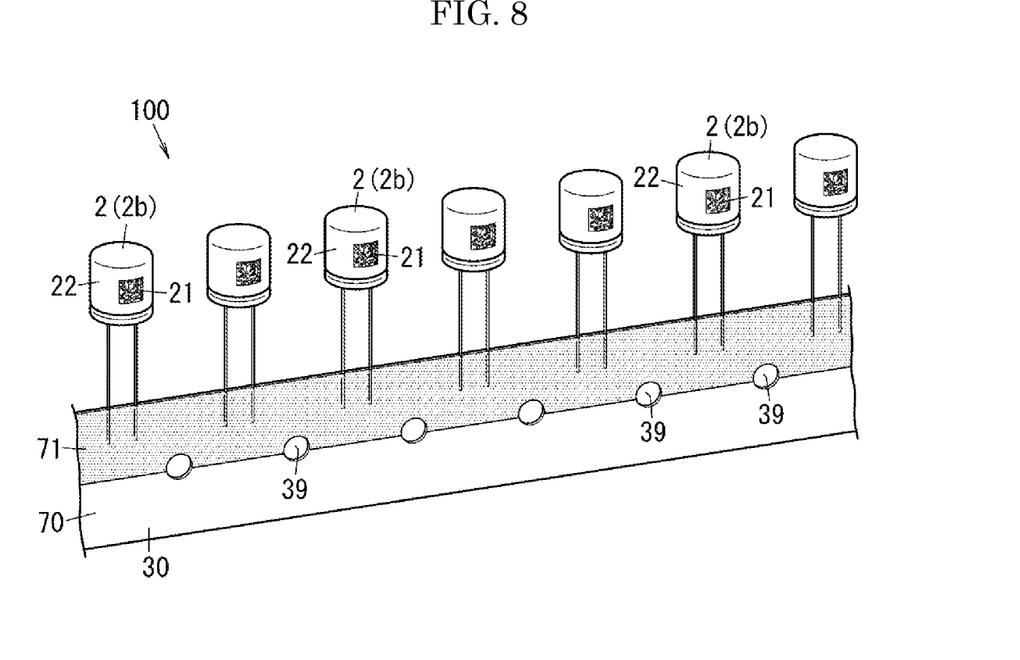
FIG. 8 is a perspective view illustrating a part of an electronic component set according to a second exemplary embodiment.

Electronic component set 100 according to the present exemplary embodiment is different from electronic component set 1 according to the first exemplary embodiment in a configuration of electronic component 2 and a configuration of adhesive fixing member 30.

Hereinafter, the same components as those in the first exemplary embodiment will be denoted by the same reference numerals, and the description thereof will be appropriately omitted.

The configuration described in the second exemplary embodiment can be applied in combination with the configuration (including modifications) described in the first exemplary embodiment as appropriate.

Electronic component 2 is through-hole mounting type capacitor 2b. That is, thin anode lead terminal 14 and cathode lead terminal 15 project below case 23. Side surface 22 of case 23 has identification unit 21.

Further, adhesive fixing member 30 has base material 70 and adhesive portion 71. Base material 70 is elongated (strip-shaped) and is formed in a plate shape, a sheet shape, or a film shape. Base material 70 has a plurality of catches 39 for hooking arranged at predetermined intervals along a longitudinal direction. In FIG. 8, each of the plurality of catches 39 for hooking is a hole that penetrates base material 70 in a thickness direction. Further, each of the plurality of catches 39 for hooking is located at a central of base material 70 in a short-length direction. Base material 70 is formed of a material such as resin or paper. Here, adhesive fixing member 30 is an example of a "holding member" within the claims Adhesive portion 71 is located on an upper half of one side of base material 70. Adhesive portion 71 is provided over substantially an entire length of base material 70 in the longitudinal direction. Adhesive portion 71 is formed by applying an adhesive resin or the like.

Electronic component 2 is held by adhesive fixing member 30 by adhering anode lead terminal 14 and cathode lead terminal 15 to adhesive portion 71. Electronic component set 100 holds the plurality of electronic components 2 in one adhesive fixing member 30. Identification units 21 of the plurality of electronic components 2 faces the same direction this is orthogonal to the longitudinal direction of base material 70. Thus, in electronic component set 100, identification unit 21 can be read by optical reader 4 from a direction intersecting a longitudinal direction of the adhesive fixing member 30. Adhesive portion 71 may be covered with an elongated (strip-shaped) lid member.

Electronic component set 100 is often shipped in a box while being held in a zigzag shape.

SUMMARY

As described above, electronic component set (1, 100) according to a first aspect includes a plurality of electronic components (2) and holding member (3, 30). Holding member (3, 30) holds the plurality of electronic components (2). Each of the plurality of electronic components (2) includes identification unit (21). The plurality of electronic components (2) are held by holding member (3, 30) to allow optical reader (4) to read identification unit (21) of the each of the plurality of electronic components (2).

According to this aspect, identification unit (21) can be read by optical reader (4) without taking out electronic component (2) from holding member (3, 30). Thus, there is an advantage that the work efficiency of reading information of electronic component (2) can be improved.

In electronic component set (1, 100) according to a second aspect, in the first aspect, identification unit (21) is located on side surface (22) of the each of the plurality of electronic components (2).

According to this aspect, there is an advantage that, by disposing reader (4) at a position facing side surface (22) of electronic component (2), identification unit (21) can be easily read by optical reader (4).

In electronic component set (1, 100) according to a third aspect, holding member (3, 30) has a strip shape in the first or second aspect. The plurality of electronic components (2) are aligned in a longitudinal direction of holding member (3, 30). Identification unit (21) is located in an area of the each of the plurality of electronic components, which is readable by optical reader (4) from a direction intersecting the longitudinal direction.

According to this aspect, identification unit (21) of each of the plurality of electronic components (2) can be read continuously or intermittently by moving at least one of electronic component set (1) and optical reader (4) along the longitudinal direction of holding members (3, 30). Thus, there is an advantage that the work efficiency of reading information of electronic component (2) can be improved.

In electronic component set (1) according to a fourth aspect, in any one of the first to third aspects, holding member (3, 30) includes packaging member (3) that packages the plurality of electronic components (2). Packaging member (3) includes light-transmitting window (31) located in a first area of packaging member (3), the first area being corresponding to identification unit (21).

According to this aspect, there is an advantage that identification unit (21) can be easily read by optical reader (4) through window (31).

In electronic component set (1) according to a fifth aspect, light-transmitting window (31) has a flat shape in the fourth aspect.

According to this aspect, there is an advantage that diffused reflection of light is less likely to occur in window (31), and identification unit (21) can be easily read by optical reader (4) through window (31).

In electronic component set (1) according to a sixth aspect, in the fourth or fifth aspect, packaging member (3) includes rib (32) located in a second area other than the first area where light-transmitting window (31) is located.

According to this aspect, there is an advantage that packaging member (3) can be reinforced by rib (32) without impairing the light transmission of window (31) so as not to reduce the readability of identification unit (21), and thus strength of packaging member (3) can be improved.

In electronic component set (1, 100) according to a seventh aspect, in any one of the first to sixth aspects, identification unit (21) provides identification information for identifying the each of the plurality of electronic components (2).

According to this aspect, by reading identification unit (21) with optical reader (4), there is an advantage that it is possible to easily obtain the identification information for identifying each of the plurality of electronic components (2).

Capacitor (2a, 2b) according to an eighth aspect includes identification unit (21). Capacitor (2a, 2b) is one of a plurality of electronic components (2) that are included in electronic component set (1, 100). Electronic component set (1, 100) further includes holding member (3, 30) that holds the plurality of electronic components (2). The plurality of electronic components (2) are held by holding member (3, 30) to allow optical reader (4) to read identification unit (21) of capacitor (2a, 2b).

According to this aspect, there is an advantage that it is possible to eliminate the work of taking out capacitor (2a, 2b) from packaging member (3), and it is possible to improve the work efficiency of reading information of capacitor (2a, 2b).

A method for manufacturing electronic component set (1, 100) according to a ninth aspect includes: a step of preparing holding member (3, 30) and a plurality of electronic components (2); and a step of causing holding member (3, 30) to hold the plurality of electronic components (2).

According to this aspect, there is an advantage that electronic component set (1, 100) capable of improving the work efficiency of reading information of electronic components (2) can be manufactured.

A method for reading an identification unit of an electronic component according to a tenth aspect includes a step of reading the identification unit from the electronic component set in a state that the plurality of electronic components (2) included in the electronic component set (1, 100) are held by holding member (3, 30).

According to this aspect, there is an advantage that identification unit (21) can be read by optical reader (4) without taking out electronic components (2) from packaging member (3), and the work efficiency of information reading of electronic component (2) can be improved.

Reader (4) for reading an identification unit in an electronic component set according to an eleventh aspect includes reading unit (49) configured to read identification unit (21) in a state that the plurality of electronic components (2) included in electronic component set (1, 100) are held by holding member (3, 30).

According to this aspect, there is an advantage that identification unit (21) can be read by reading unit (49) without taking out electronic components (2) from holding member (3, 30), and the work efficiency of information reading of electronic components (2) can be improved.

Each of configurations according to the first to seventh aspects is not essential configuration for electronic component set (1, 100) and a part or entire of the configurations can be omitted as appropriate.

What is claimed is:

1. An electronic component set comprising:
   a plurality of electronic components; and
   a holding member that holds the plurality of electronic components, wherein:
   each of the plurality of electronic components includes an identification unit provided to a surface of the each of the plurality of electronic component, and
   the plurality of electronic components are held by the holding member to allow an optical reader to read the identification unit of the each of the plurality of electronic components.

2. The electronic component set according to claim 1, wherein the identification unit is located on a side surface of the each of the plurality of electronic components.

3. The electronic component set according to claim 1, wherein:
   the holding member has a strip shape,
   the plurality of electronic components are aligned along a longitudinal direction of the holding member, and
   the identification unit is located in an area of the each of the plurality of electronic components, the area being readable by the optical reader from a direction intersecting the longitudinal direction.

4. The electronic component set according to claim 1, wherein:
   the holding member includes a packaging member that packages the plurality of electronic components, and
   the packaging member includes a light-transmitting window located in a first area of the packaging member, the first area overlapping the identification unit.

5. The electronic component set according to claim 4, wherein the light-transmitting window has a flat shape.

6. The electronic component set according to claim 4, wherein the packaging member includes a rib located in a second area other than the first area where the light-transmitting window is located.

7. The electronic component set according to claim 1, wherein the identification unit indicates identification information that identifies the each of the plurality of electronic components.

8. A method for manufacturing the electronic component set according to claim 1, the method comprising:
   a step of preparing a holding member and a plurality of electronic components; and
   a step of causing the holding member to hold the plurality of electronic components.

9. A method for reading an identification unit in the electronic component set according to claim 1, the method comprising a step of reading the identification unit from the electronic component set in a state that the plurality of electronic components included in the electronic component set are held by the holding member.

10. A reader for reading an identification unit in the electronic component set according to claim 1, the reader comprising a reading unit configured to read the identification unit from the electronic component set in a state that the plurality of electronic components included in the electronic component set are held by the holding member.

11. The electronic component set according to claim 4, wherein the identification unit of the each of the plurality of electronic components packaged in the packaging member is readable by a light passing though the light-transmitting window from the optical reader.

12. The electronic component set according to claim 4, wherein:
   the each of the plurality of electronic components includes a lead terminal projecting from the each of the plurality of electronic components,
   the packaging member includes a terminal housing portion by forming a step on an inside surface of the packaging member,
   a tip portion of the lead terminal is housed in the terminal housing portion.

13. The electronic component set according to claim 12, wherein an inside surface of the light-transmitting window and an inside surface of the terminal housing portion are continuous with no step.

14. The electronic component set according to claim 1, wherein the identification unit includes a matrix-type two-dimensional code.

15. The electronic component set according to claim 1, wherein:
   each of the plurality of electronic components is a capacitor having an anode terminal and a cathode terminal,
   the holding member includes a plurality of packaging members that package the plurality of electronic components, respectively, and
   each of the plurality of packaging member includes terminal housing portions to which the anode terminal and cathode terminal are inserted so that the identification unit of each of the plurality of electronic components is oriented to a same face.

* * * * *